(12) United States Patent
Huang

(10) Patent No.: US 10,790,843 B2
(45) Date of Patent: Sep. 29, 2020

(54) ANALOG-TO-DIGITAL CONVERTER DEVICE

(71) Applicant: Realtek Semiconductor Corporation, Hsinchu (TW)

(72) Inventor: Shih-Hsiung Huang, Miaoli County (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/671,324

(22) Filed: Nov. 1, 2019

(65) Prior Publication Data

US 2020/0228129 A1 Jul. 16, 2020

Related U.S. Application Data

(60) Provisional application No. 62/826,164, filed on Mar. 29, 2019, provisional application No. 62/806,026, filed on Feb. 15, 2019, provisional application No. 62/791,128, filed on Jan. 11, 2019.

(51) Int. Cl.
*H03M 1/06* (2006.01)
*H03M 1/08* (2006.01)

(52) U.S. Cl.
CPC ............................... *H03M 1/0854* (2013.01)

(58) Field of Classification Search
CPC ...... H03M 1/0854; H03M 1/12; H03M 1/802; H03M 1/804; H03M 1/806; H03M 1/00
USPC .................. 341/155, 172, 161, 118
See application file for complete search history.

(56) References Cited

U.S. PATENT DOCUMENTS

| 6,587,066 | B1 | 7/2003 | Somayajula |
| 6,914,550 | B2* | 7/2005 | Cai ........................ H03M 1/164 341/150 |
| 8,279,102 | B2 | 10/2012 | Lai et al. |
| 8,576,104 | B2* | 11/2013 | Steensgaard-Madsen .................... H03M 3/378 341/155 |

(Continued)

FOREIGN PATENT DOCUMENTS

| TW | 201251341 A1 | 12/2012 |
| TW | 201715849 A1 | 5/2017 |

OTHER PUBLICATIONS

T. Cho et al., "A 10 b, 20 Msample/s, 35 mW pipeline A/D converter," IEEE Journal of Solid-State Circuits, vol. 30, No. 3, pp. 166-172, Mar. 1995.

(Continued)

*Primary Examiner* — Jean B Jeanglaude
(74) *Attorney, Agent, or Firm* — Locke Lord LLP; Tim Tingkang Xia, Esq.

(57) ABSTRACT

An analog-to-digital converter (ADC) device includes capacitor arrays, successive approximation register (SAR) circuitries, and noise shaping circuitries. The capacitor arrays sample an input signal by turns, in order to provide a sampled input signal. The SAR circuitries perform an analog-to-digital conversion by turns according to a combination of the sampled input signal, a first residue signal, and a second residue signal, in order to generate digital outputs. The noise shaping circuitries receive a corresponding residue signal of the first residue signal the second residue signal in response to the analog-to-digital conversion, and to shape and transmit the corresponding residue signal to the SAR circuitries.

20 Claims, 11 Drawing Sheets

(56) References Cited

U.S. PATENT DOCUMENTS

| | | | |
|---|---|---|---|
| 8,710,896 B2 | 4/2014 | Allen et al. | |
| 8,786,484 B2 | 7/2014 | Cheong et al. | |
| 8,797,204 B2 | 8/2014 | Yoon et al. | |
| 8,952,839 B2 | 2/2015 | Wang et al. | |
| 9,030,346 B2 | 5/2015 | Dey et al. | |
| 9,041,569 B2 | 5/2015 | Zhou et al. | |
| 9,106,243 B2 | 8/2015 | Lee et al. | |
| 9,287,891 B1 | 3/2016 | Lee et al. | |
| 9,425,818 B1* | 8/2016 | Rajaee | H03M 3/32 |
| 9,455,737 B1* | 9/2016 | Rajaee | H03M 3/464 |
| 9,847,790 B2 | 12/2017 | Liu | |
| 10,050,639 B1 | 8/2018 | Berens et al. | |
| 10,110,242 B2* | 10/2018 | Liu | H03M 1/403 |
| 10,171,097 B1 | 1/2019 | Lin et al. | |
| 10,340,932 B2* | 7/2019 | Bandyopadhyay | H03M 3/426 |
| 2005/0078025 A1* | 4/2005 | Cai | H03M 1/164 |
| | | | 341/162 |
| 2008/0129573 A1 | 6/2008 | Mueck et al. | |
| 2011/0122006 A1 | 5/2011 | Liao et al. | |
| 2012/0081244 A1 | 4/2012 | Lai et al. | |
| 2013/0002467 A1* | 1/2013 | Wang | H03M 1/145 |
| | | | 341/172 |
| 2013/0147649 A1 | 6/2013 | Cheong et al. | |
| 2014/0049872 A1 | 2/2014 | Huang et al. | |
| 2014/0246562 A1 | 9/2014 | Blerkom | |
| 2014/0320330 A1 | 10/2014 | Yang | |
| 2017/0317683 A1* | 11/2017 | Bandyopadhyay | H03M 3/426 |
| 2018/0183450 A1 | 6/2018 | Liu | |

OTHER PUBLICATIONS

R. Lotfi et al., "A 1-V MOSFET-Only Fully-Differential Dynamic Comparator for Use in Low-Voltage Pipelined A/D Converters", Signals, Circuits and Systems, SCS 2003.

* cited by examiner

ANALOG-TO-DIGITAL CONVERTER DEVICE

RELATED APPLICATIONS

This application claims priority to U.S. Provisional Application Ser. No. 62/791,128, filed Jan. 11, 2019, U.S. Provisional Application Ser. No. 62/806,026, filed Feb. 15, 2019, and U.S. Provisional Application Ser. No. 62/826,164, filed Mar. 29, 2019 all of which are herein incorporated by reference in their entireties.

BACKGROUND

Technical Field

The present disclosure relates to an analog-to-digital converter (ADC) device. More particularly, the present disclosure relates to a time interleaved successive approximation register ADC having a noise shaping function.

Description of Related Art

An analog-to-digital converter (ADC) has been widely applied to various electronic devices, in order to covert an analog signal to a digital signal for subsequent signal processing. As the need of processing data with high resolution (for example, video data) rises, the ADC is often the key component in the system. However, in practical applications, performance of the ADC is affected by non-ideal factors, such as process variations, quantization noise, thermal noise, and so on.

SUMMARY

Some aspects of the present disclosure are to provide an analog-to-digital converter (ADC) device that includes capacitor arrays, successive approximation register (SAR) circuitries, and noise shaping circuitries. The capacitor arrays sample an input signal by turns, in order to provide a sampled input signal. The SAR circuitries perform an analog-to-digital conversion by turns according to a combination of the sampled input signal, a first residue signal, and a second residue signal, in order to generate digital outputs. The noise shaping circuitries receive a corresponding residue signal of the first residue signal the second residue signal in response to the analog-to-digital conversion, and to shape and transmit the corresponding residue signal to the SAR circuitries.

As described above, the ADC devices of embodiments of the present disclosure are able to provide a circuit architecture that has a noise-shaping function and time-interleaved conversion. As a result, the overall performance of the ADC device can be improved.

DETAILED DESCRIPTION

In this document, the term "circuitry" may indicate a system formed with one or more circuits. The term "circuit" may indicate an object, which is formed with one or more transistors and/or one or more active/passive elements based on a specific arrangement, for processing signals.

For ease of understanding, like elements in each figure are designated with the same reference number.

Figure 1:
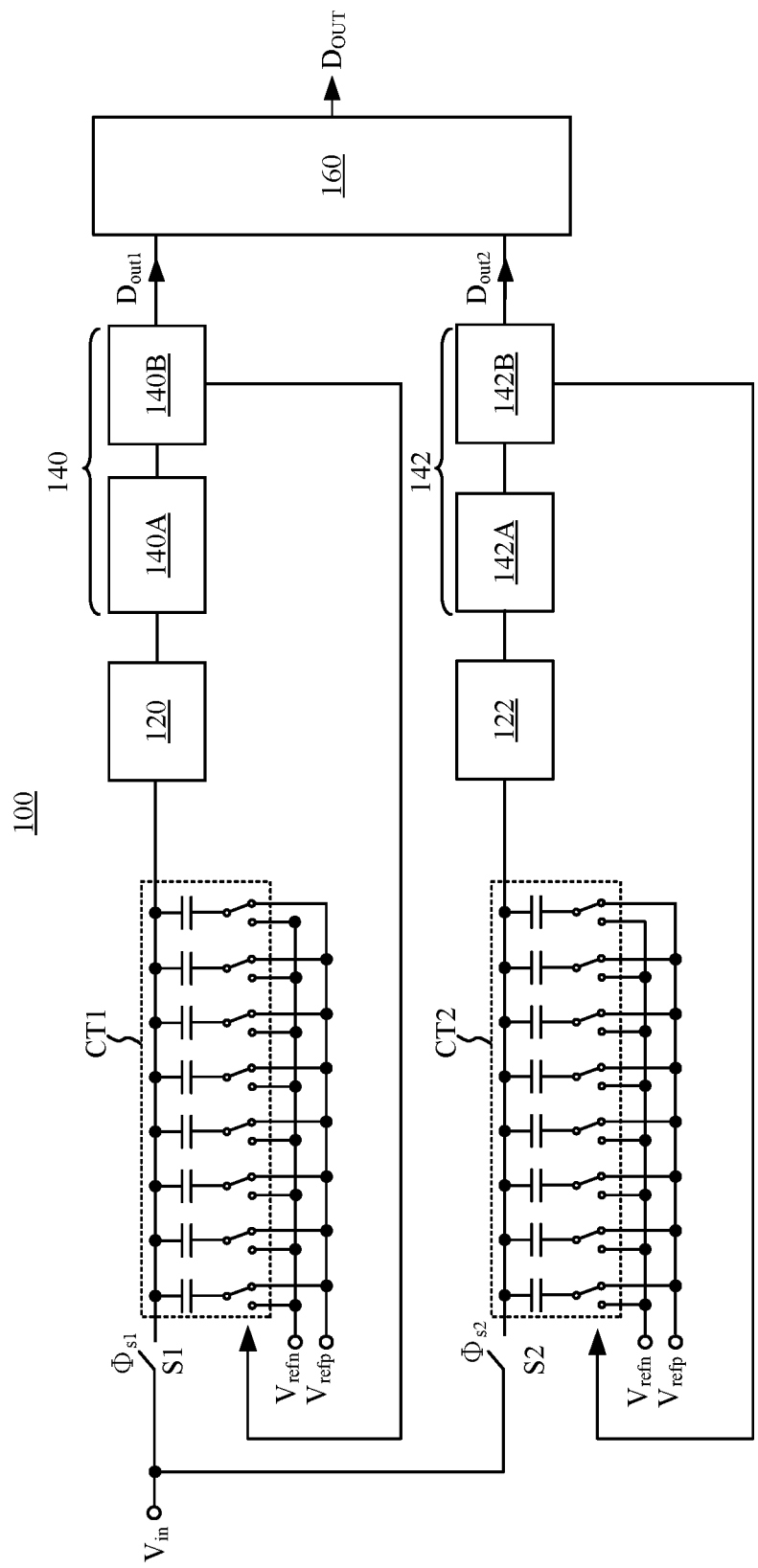
FIG. 1 is a schematic diagram of an analog-to-digital converter (ADC) device according to some embodiments of the present disclosure.

FIG. 1 is a schematic diagram of an analog-to-digital converter (ADC) device 100 according to some embodiments of the present disclosure. In some embodiments, the ADC device 100 operates as a time interleaved successive approximation register (SAR) ADC.

The ADC device 100 includes switches S1 and S2, capacitor arrays CT1 and CT2, noise shaping circuitries 120 and 122, SAR circuitries 140 and 142, and a data combination circuitry 160. The switches S1 and S2 are conducted (e.g., closed) according to enabling levels of clock signals $\phi_{s1}$ and $\phi_{s2}$ respectively. The switches S1 and S2 are conducted by turns, such that the input signal $V_{in}$ is sampled by the capacitor arrays CT1 and CT2 by turns. For example, in phase k, the capacitor array CT1 provides the input signal $V_{in}$ sampled in phase k−1 to the noise shaping circuitries 120 and/or the SAR circuitry 140, and the capacitor CT2 samples the current input signal $V_{in}$ as a sampled input signal $V_{in}(k)$. Then, in phase k+1, the capacitor array CT2 provides the sampled input signal $V_{in}(k)$ to the noise shaping circuitry 122 and/or the SAR circuitry 142, and the capacitor CT2 samples the current input signal $V_{in}$ as a sampled input signal $V_{in}(k+1)$.

In some embodiments, each of the noise shaping circuitries 120 and 122 is configured to shape residue signals (e.g., $V_{res1}$ and $V_{res2}$ in FIGS. 2A and 2B) during an analog to digital (ND) conversion. In some approaches, only one noise shaping circuitry is employed and to shape one of residue signals on multiple capacitor arrays. In these approaches, when one channel of ADC circuit performs the A/D conversion, quantization errors and/or noises from other channel of ADC circuit are not considered. Compared with the above approaches, in response to one A/D conversion performed by one channel of ADC circuits (e.g., SAR circuitry 140 or 142), both of the noise shaping circuitries 120 and 122 receive the residue signal on the corresponding capacitor CT1 or CT2. Accordingly, a signal-to-noise ratio of the ADC device 100 can be further improved by considering more noise information.

In examples of FIG. 1, the noise shaping circuitry 120 and the capacitor array CT1 are coupled in series, and the noise shaping circuitry 122 and the capacitor array CT2 are coupled in series. In some embodiments, the shaping function may be achieved by the integration of the residue signals and the sampled input signal $V_{in}(k)$, and each of the noise shaping circuitries 120 and 122 may be implemented with a passive integrator circuit or an active integrator circuit accordingly, and the present disclosure is not limited thereto.

In some embodiments, when the input signal $V_{in}$ is sampled by the capacitor array CT1 (or CT2), the corresponding SAR circuitry 140 (or 142) may be disabled. The disabled SAR circuitry 140 (or 142) provides high impedance, such that the sampling of the input signal $V_{in}$ is not affected. In some alternative embodiments, an additional switch (not shown) may be employed to provide such high impedance. For example, the additional switch is coupled between the capacitor array CT1 and the noise shaping circuitry 120 (or between the capacitor array CT2 and the noise shaping circuitry 122), and is open (e.g., not conducted) in response to the enabling level of the clock signal $\phi_{s1}$ (or $\phi_{s2}$) to provide the above high impedance. The additional switch is closed during the A/D conversion.

The SAR circuitries 140 and 142 are coupled to noise shaping circuitries 120 and 122 respectively, in order to receive the sampled input signal $V_{in}$ and/or the residue signals. The SAR circuitry 140 includes a quantizer circuit 140A and a control logic circuit 140B. The SAR circuitry 142 includes a quantizer circuit 142A and a control logic circuit 142B. Operations and configurations of the quantizer circuit 140A and the control logic circuit 140B are similar to those of the quantizer circuit 142A and the control logic circuit 142B. The following paragraph is given with examples of the SAR circuitry 140, but the operations and configurations of the SAR circuitry 142 can be understood with reference to these examples.

The SAR circuitry 140 performs a binary search algorithm based on the sampled input signal $V_{in}$ and common voltages $V_{refn}$ and $V_{refp}$. In some embodiments, the binary search algorithm is performed under a control of the control logic circuit 140B. In response to the sampled input signal $V_{in}$ from the capacitor array CT1 and the residue signals, the quantizer circuit 140A and the control logic circuit 140B perform the binary search algorithm, in order to execute the A/D conversion on the sampled input signal $V_{in}$. During the A/D conversion, switches of the capacitor array CT1 are controlled by the control logic circuit 140B, such that the quantizer circuit 140A decides a digital output $D_{out1}$. With similar operations, in response to the sampled input signal $V_{in}$ from the binary capacitor array CT2 and the residue signals, a digital output $D_{out2}$ is generated from the SAR circuitry 142.

The data combination circuitry 160 is coupled to the quantizer circuits 140A and 142A, in order to receive the digital outputs $D_{out1}$ and $D_{out2}$. The data combination circuitry 160 combines the digital outputs $D_{out1}$ and $D_{out2}$ as digital data $D_{OUT}$.

In some embodiments, the quantizer circuits 140A and 142A may be implemented with comparator circuits. In some embodiments, the control logic circuits 140B and 142B may be implemented with digital controller circuits. In some embodiments, the data combination circuitry 160 may be implemented with a multiplexer circuit. In some embodiments, the data combination circuitry 160 may be implemented with a data encoder/decoder circuit. The implementations of the above circuitries are given for illustrative purposes only, and various implementations of the above circuitries are within the contemplated scope of the present disclosure.

Figure 2A:
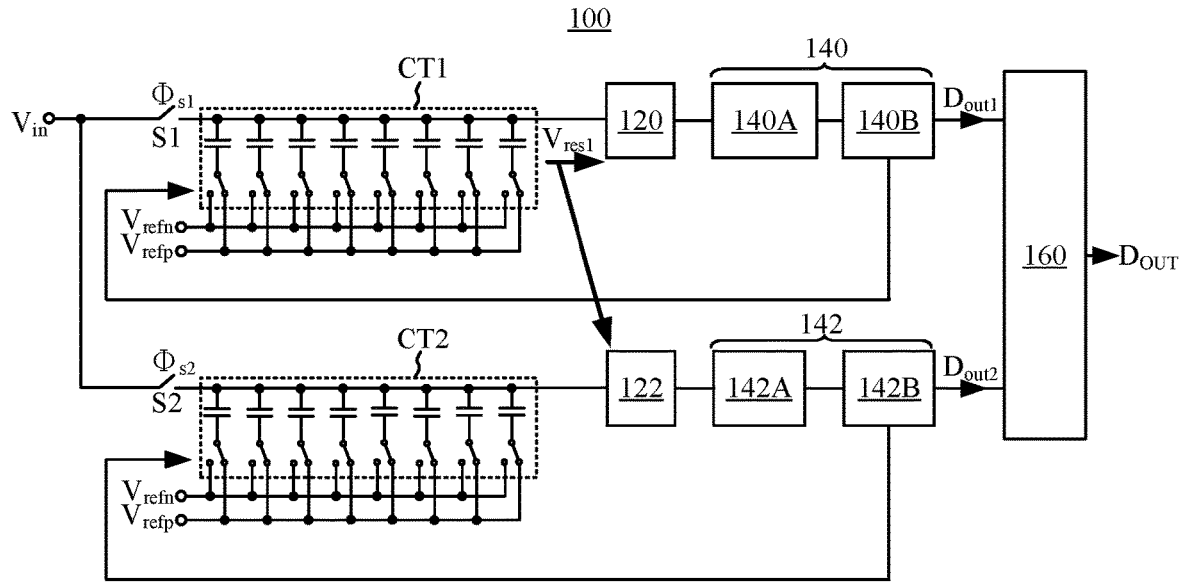
FIG. 2A is a schematic diagram showing an operation of the ADC device in FIG. 1 according to some embodiments of the present disclosure.

It is noted that the data combination circuitry 160 is omitted in following figures for simplification. FIG. 2A is a schematic diagram showing an operation of the ADC device 100 according to some embodiments of the present disclosure.

In some embodiments, the residue signal $V_{res1}$ is stored on the capacitor array CT1 in response to the A/D conversion performed with the SAR circuitry 140. In some embodiments, the residue signal $V_{res1}$ may be stored on the capacitor array CT1 in a progress of the A/D conversion performed with the SAR circuitry 140. In some embodiments, the residue signal $V_{res1}$ may be stored on the capacitor array CT1 after the A/D conversion performed with the SAR circuitry 140 is complete.

In some embodiments, the residue signal $V_{res1}$ is provided to the noise shaping circuitries 120 and 122. As a result, in operations of the ADC device 100, quantization noise(s) and other noise(s) such as noise caused from the quantizer circuit 140A are provided to both of the noise shaping circuitries 120 and 122.

Figure 2B:
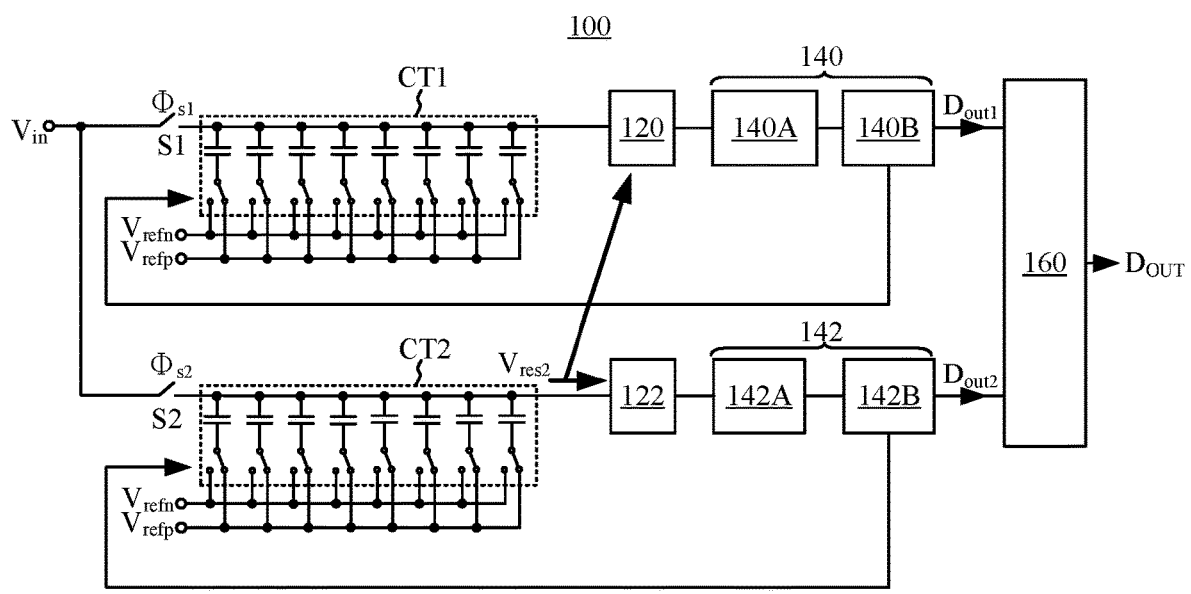
FIG. 2B is a schematic diagram showing an operation of the ADC device in FIG. 1 according to some embodiments of the present disclosure.

FIG. 2B is a schematic diagram showing an operation of the ADC device 100 according to some embodiments of the present disclosure.

In some embodiments, the residue signal $V_{res2}$ is stored on the capacitor array CT2 in response to the A/D conversion performed with the SAR circuitry 142. In some embodiments, the residue signal $V_{res2}$ may be stored on the capacitor array CT2 in a progress of the A/D conversion performed with the SAR circuitry 142. In some embodiments, the residue signal $V_{res2}$ may be stored on the capacitor array CT2 after the A/D conversion performed with the SAR circuitry 142 is complete.

In some embodiments, the residue signal $V_{res2}$ is provided to the noise shaping circuitries 120 and 122. As a result, in operations of the ADC device 100, quantization noise(s) and other noise(s) such as noise caused from the quantizer circuit 142A are provided to both of the noise shaping circuitries 120 and 122.

Figure 3A:
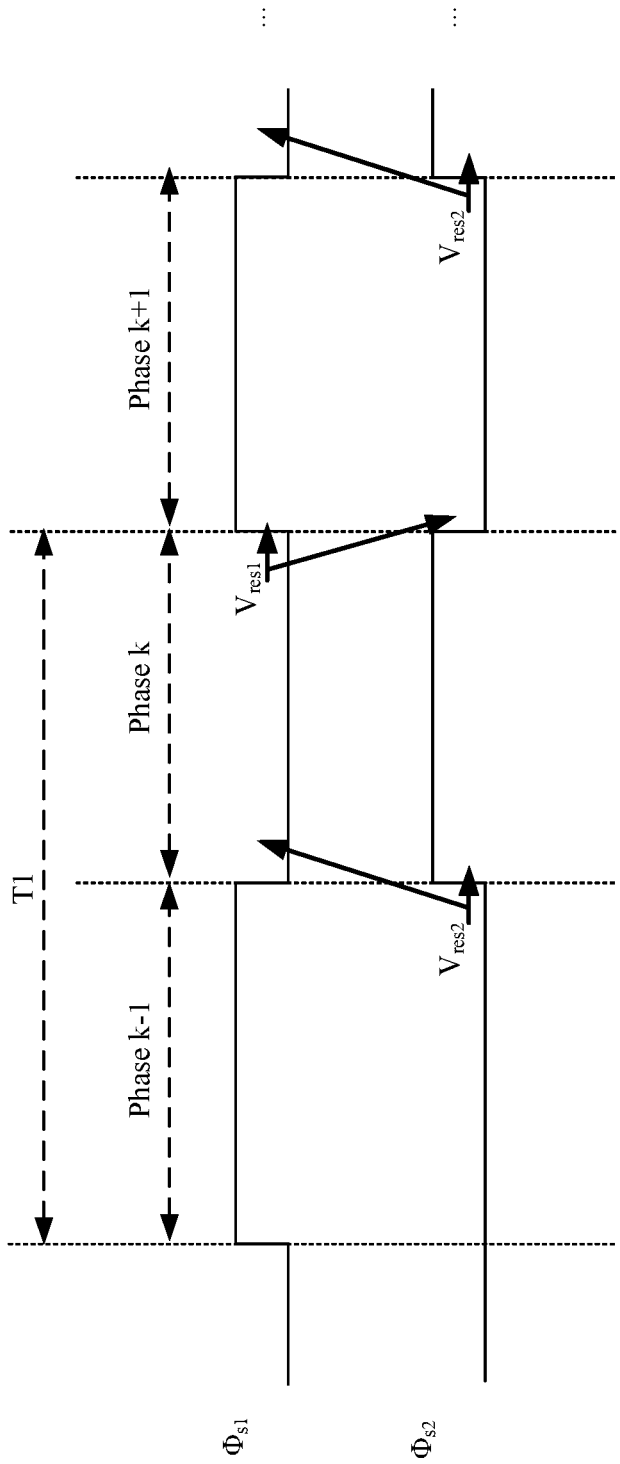
FIG. 3A is a schematic diagram illustrating waveforms of the clock signals in FIG. 1 according to some embodiments of the present disclosure.

FIG. 3A is a schematic diagram illustrating waveforms of the clock signals $\phi_{s1}$ and $\phi_{s2}$ in FIG. 1 according to some embodiments of the present disclosure.

In phase k−1, the clock signal $\phi_{s1}$ has the enabling level (e.g., high level), and the clock signal $\phi_{s2}$ has a disabling level (e.g., low level). Under this condition, the switch S1 is conducted (e.g., closed) and the switch S2 is not conducted (e.g., open). As a result, the capacitor array CT1 samples the current input signal $V_{in}$ as the sampled input signal $V_{in}(k-1)$, while the SAR circuitry 142 performs the A/D conversion in response to the input signal $V_{in}$ sampled un a previous phase k−2 (not shown) and previous residue signals (not shown). After the A/D conversion performed with the SAR circuitry 142 is complete, the residue signal $V_{res2}$ is stored on the capacitor array CT2 and is transmitted to both of the noise shaping circuitries 120 and 122.

In phase k, the clock signal $\phi_{s2}$ has the enabling level, and the clock signal $\phi_{s1}$ has the disabling level. Under this condition, the switch S2 is conducted, and the switch S1 is not conducted. As a result, the capacitor array CT2 samples the current input signal $V_{in}$ as the sampled input signal $V_{in}$(k), while the SAR circuitry 140 performs the A/D conversion in response to the sampled input signal $V_{in}$(k−1) and the residue signal $V_{res2}$. After the A/D conversion performed with the SAR circuitry 140 is complete, the residue signal $V_{res1}$ is stored on the capacitor array CT1 and is transmitted to both of the noise shaping circuitries 120 and 122. With this analogy, operations of the ADC device 100 can be understood.

In this example, the time interval for performing the A/D conversion may be the same as the time interval for sampling the input signal W. In some embodiments, a time interval of the clock signal $\phi_{s1}$ (or $\phi_{s2}$) having the enabling level takes about 50% of a period T1 (e.g., a complete on-and-off cycle, or a time corresponding to a summation of two successive phases k−1 and k). Correspondingly, a time interval of the clock signal $\phi_{s1}$ (or $\phi_{s2}$) having the disabling level takes about 50% of the period T1. With this configuration, the ADC device 100 is allowed to sample the input signal $V_{in}$ in sufficient time.

Figure 3B:
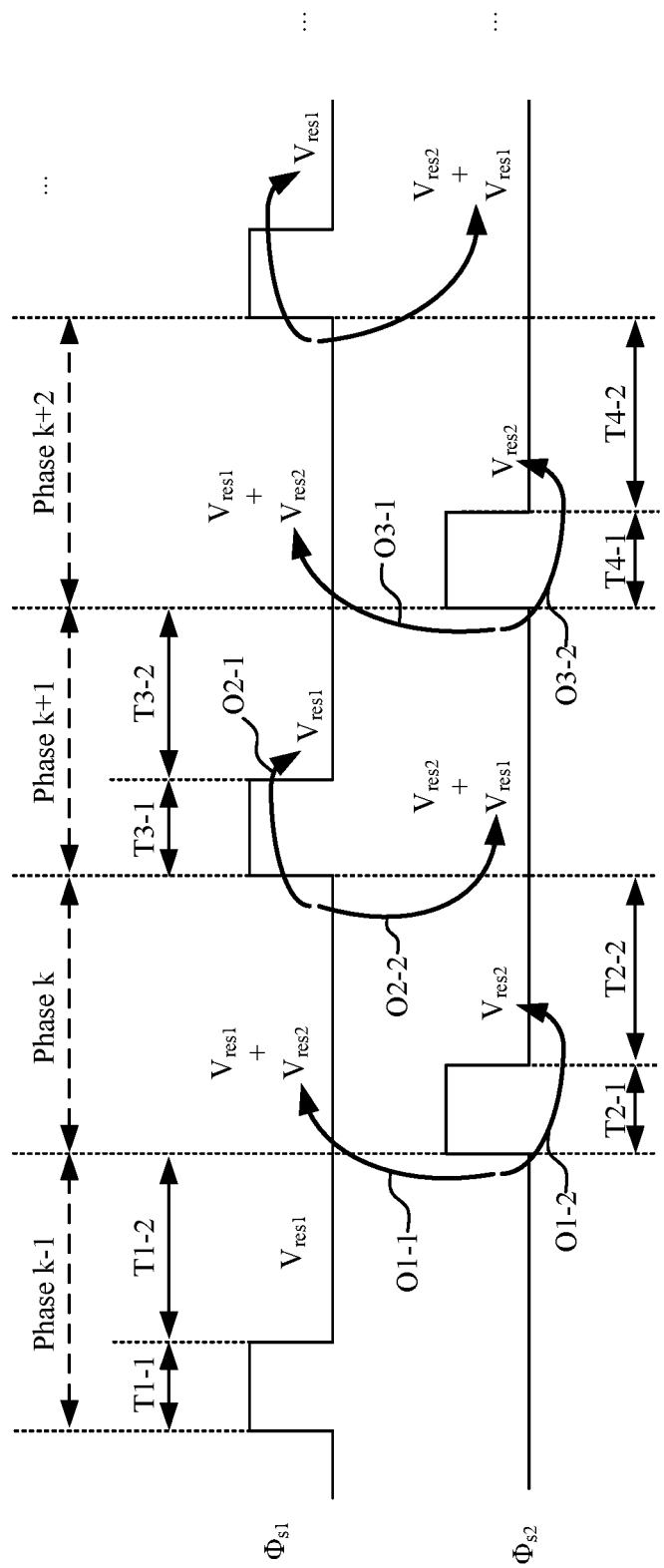
FIG. 3B is a schematic diagram illustrating waveforms of the clock signals in FIG. 1 according to some embodiments of the present disclosure.

FIG. 3B is a schematic diagram illustrating waveforms of the clock signals $\phi_{s1}$ and $\phi_{s2}$ in FIG. 1 according to some embodiments of the present disclosure.

In certain cases, a performance of the ADC device 100 may be limited by a time of performing the A/D conversion. In some embodiments, timing allocations shown in FIG. 3B are for improving such limitation.

As shown in FIG. 3B, in a sampling time T1-1 (e.g., a time interval of the clock signal $\phi_{s1}$ having the enabling level) of phase k−1, the switch S1 is conducted, such that the input signal $V_{in}$ is sampled by the capacitor array CT1 as the sampled input signal $V_{in}$(k−1) (not shown). In a remaining time T1-2 (e.g., the time interval of the clock signal $\phi_{s1}$ having the disabling level) of phase k−1, the SAR circuitry 140 starts performing the A/D conversion with the input signal $V_{in}$(k−1) and a residue signal $V_{res1}$ (which may be generated from a previous phase, e.g., phase k−2). In phase k−1, the clock signal $\phi_{s2}$ has the disabling level, and the residue signal $V_{res2}$ is generated in response to the A/D conversion performed by the SAR circuitry 142. The residue signal $V_{res2}$ is then transmitted to the noise shaping circuitry 120 (e.g., operation O1-1) and the noise shaping circuitry 122 (e.g., operation O1-2).

In phase k, the clock signal $\phi_{s1}$ has the disabling level, and the SAR circuitry 140 completes the A/D conversion that is performed with the input signal $V_{in}$(k−1) and signal(s) stored in the noise shaping circuitry 120, in which the signals stored in the noise shaping circuitry 120 are determined based on the residue signals $V_{res1}$ and $V_{res2}$. It should be noted that, although the SAR circuitry 140 performs the A/D conversion without consideration of the residue signal $V_{res2}$ in phase k−1, the SAR circuitry 140 still takes residue signal $V_{res2}$ into account in phase k, in which the residue signal $V_{res2}$ normally affects least significant bits corresponding to the input signal $V_{in}$(k−1). In response to this A/D conversion, a corresponding residue signal $V_{res1}$ is stored on the capacitor array CT1, and is transmitted to the noise shaping circuitry 120 (e.g., operation O2-1) and the noise shaping circuitry 122 (e.g., operation O2-2). In a sampling time T2-1 (e.g., a time interval of the clock signal $\phi_{s2}$ having the enabling level) of phase k, the switch S2 is conducted, such that the input signal $V_{in}$ is sampled by the capacitor array CT2 as the sampled input signal $V_{in}$(k) (not shown). In a remaining time T2-2 (e.g., the time interval of the clock signal $\phi_{s2}$ having the disabling level) of phase k, the SAR circuitry 142 starts performing the A/D conversion with the input signal $V_{in}$(k) and the residue signal $V_{res2}$.

In phase k+1, the clock signal $\phi_{s2}$ has the disabling level, and the corresponding residue signal $V_{res1}$ is transmitted to the noise shaping circuitry 122 (e.g., operation O2-2) such that the SAR circuitry 142 can complete the A/D conversion which is started in phase k and performed with the sampled input signal $V_{in}$(k) and signals stored in the noise shaping circuitry 122, in which the signals stored in the noise shaping circuitry 122 are determined based on the residue signals $V_{res1}$ and $V_{res2}$. In response to this A/D conversion, a corresponding residue signal $V_{res2}$ is stored on the capacitor array CT2, and is transmitted to the noise shaping circuitry 120 (e.g., operation O3-1) and the noise shaping circuitry 122 (e.g., operation O3-2). By this analogy, operations performed in a sampling time T4-1 and a remaining time T4-2 in phase k+2 can be understood.

As shown in FIG. 3B, in phase k, the time interval of the clock signal $\phi_{s1}$ having the disabling level and the sampling time T2-1 are partially overlapped. Similarly, in phase k+1, the time interval of the clock signal $\phi_{s2}$ having the disabling level and a sampling time T3-1 are partially overlapped. With this configuration, each A/D conversion is performed in the time interval of the clock signal $\phi_{s1}$ (or $\phi_{s2}$) having the disabling level of two successive phases (e.g., phases k and k+1). Accordingly, the sampling time of the ADC device 100 is shortened, and the ADC device 100 is allowed to perform the A/D conversion in a more sufficient time interval. As a result, the ADC device 100 is able to operate at a higher clock rate.

In some embodiments, in two successive phases (e.g., phase k−1 and k, or phases k and k+1), the time interval of the clock signal $\phi_{s1}$ (or $\phi_{s2}$) having the disabling level (e.g., the time for performing the A/D conversion) is longer than the sampling time (e.g., T1-1, T2-1, T3-1, or T4-1). In some embodiments, the time interval of the clock signal $\phi_{s1}$ (or $\phi_{s2}$) having the disabling level may take for about 75% of the two successive phases, and the sampling time T1-1 (or T2-1) may take for about 25% of the two successive phases. In some embodiments, the time interval of the clock signal $\phi_{s1}$ (or $\phi_{s2}$) having the disabling level may take for about 80% of the two successive phases, and the sampling time T1-1 (or T2-1) may take for about 20% of the two successive phases. In some embodiments, the time interval of the clock signal $\phi_{s1}$ (or $\phi_{s2}$) having the disabling level may take for about 90% of the two successive phases, and the sampling time T1-1 (or T2-1) may take for about 10% of the two successive phases.

In some embodiments, the residue signal $V_{res1}$ (and/or $V_{res2}$) may be transmitted to both of the noise shaping circuitries 120 and 122 simultaneously (e.g., in the sampling time T2-1 or T3-1). In some embodiments, the residue signal $V_{res1}$ may be transmitted to the noise shaping circuitry 122 at first (e.g., in the sampling time T3-1), and then transmitted to the noise shaping circuitry 120 (e.g., in the remaining time T3-2). In some embodiments, the residue signal $V_{res2}$ may be transmitted to the noise shaping circuitry 120 at first (e.g., in the sampling time T2-1), and then transmitted to the noise shaping circuitry 122 (e.g., in the remaining time T2-2).

The configurations of the clock signals $\phi_{a1}$ and $\phi_{s2}$ and values given above are given for illustrative purposes only, and the present disclosure is not limited thereto.

Figure 4A:
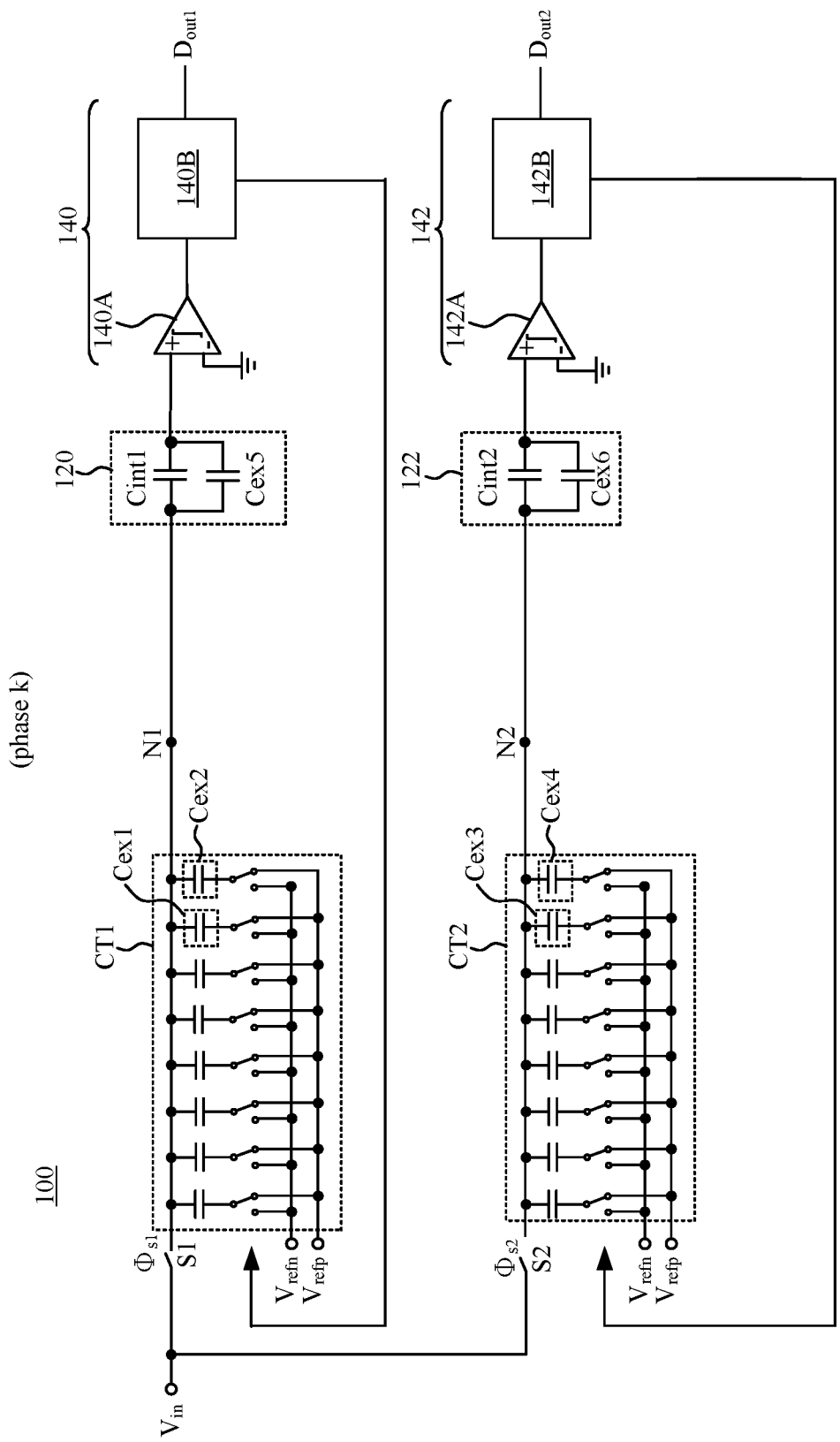
FIG. 4A is a schematic diagram of the ADC device of FIG. 1 in phase k according to some embodiments of the present disclosure.
Figure 4B:
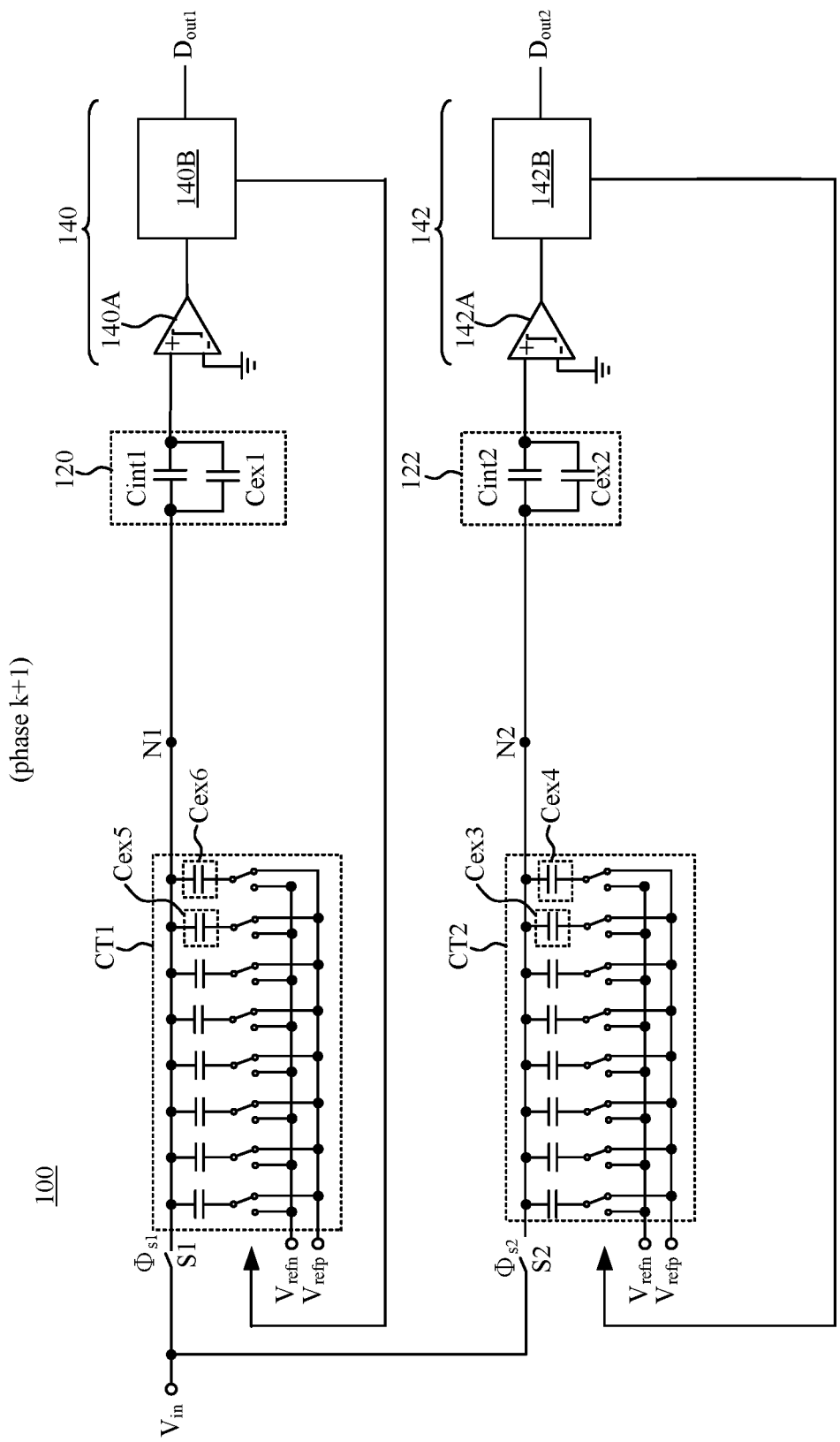
FIG. 4B is a schematic diagram of the ADC device of FIG. 1 in phase k+1 according to some embodiments of the present disclosure.
Figure 4C:
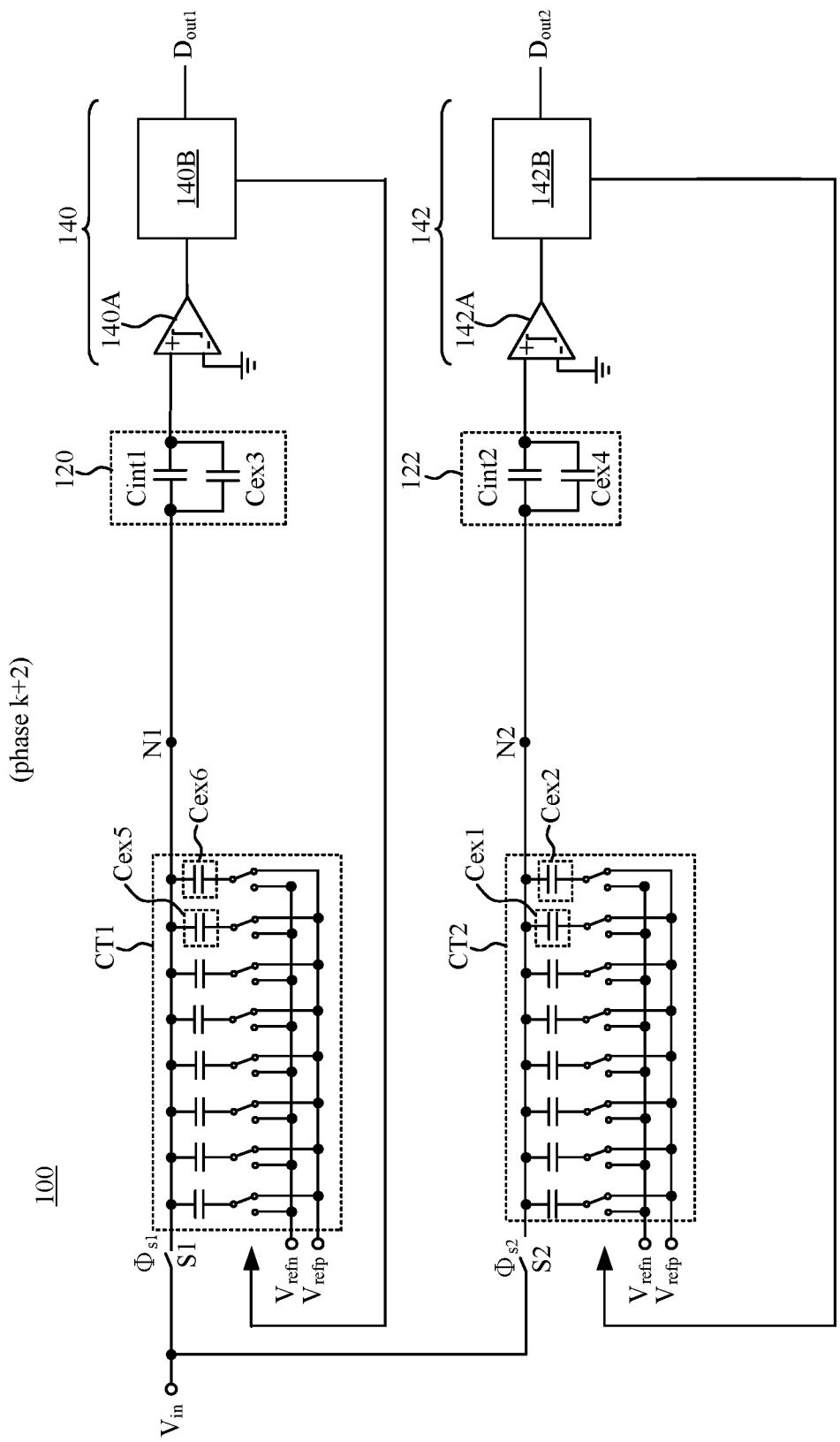
FIG. 4C is a schematic diagram of the ADC device of FIG. 1 in phase k+2 according to some embodiments of the present disclosure.

FIG. 4A is a schematic diagram of the ADC device 100 in phase k according to some embodiments of the present disclosure. FIG. 4B is a schematic diagram of the ADC device 100 in phase k+1 according to some embodiments of the present disclosure. FIG. 4C is a schematic diagram of the ADC device 100 in phase k+2 according to some embodiments of the present disclosure.

In this example, the noise shaping circuitry 120 includes a capacitor Cint1 coupled between a node N1 of the capacitor array CT1 and an input terminal of the quantizer circuit 140A. The noise shaping circuitry 122 includes a capacitor Cint2 coupled between a node N2 of the capacitor array CT2 and an input terminal of the quantizer circuit 142A.

The noise shaping circuitries 120 and 122 together include switched-capacitors Cex1-Cex6. In some embodiments, in each phase, two of the switched-capacitors Cex1-Cex6 are coupled to the capacitor array CT1, two of the switched-capacitors Cex1-Cex6 are coupled to the capacitor array CT2, and two of the switched-capacitors Cex1-Cex6 are respectively coupled in parallel with the capacitors Cint1 and Cint2.

For example, as shown in FIG. 4A, in phase k, the switched-capacitors Cex1 and Cex2 are coupled between switches of the capacitor array CT1 and the node N1 for the A/D conversion (e.g., operation in the time interval of the clock signal $\phi_{s1}$ having the disabling level in phase k). In response to this A/D conversion, the residue signal $V_{res1}$ is stored on the switched-capacitors Cex1 and Cex2. In phase k, the switched-capacitors Cex3 and Cex4 are coupled between switches of the capacitor array CT2 and the node N2 for sampling the input signal $V_1$, (e.g., operation in the sampling time T2-1). The switched-capacitors Cex5 and Cex6 are coupled in parallel with the capacitors Cint1 and Cint2 respectively to transmit the residue signal in a previous phase k−1 (not shown).

As shown in FIG. 4B, in phase k+1, the switched-capacitors Cex1 and Cex2 are respectively coupled in parallel with the capacitors Cint1 and Cint2 for charge sharing (e.g., operations O2-1 and O2-2). The switched-capacitors Cex5 and Cex6 are coupled between switches of the capacitor array CT1 and the node N1 for sampling the input signal $V_{in}$ (e.g., operations in the sampling time T3-1 of FIG. 3B). Under this condition, the residue signal $V_{res1}$ is transmitted to the capacitors Cint1 and Cint2. Accordingly, the A/D conversion corresponding to the SAR circuitry 142 is completely performed based on the residue signals $V_{res1}$ and $V_{res2}$ (e.g., operation in the time interval of the clock signal $\phi_{s2}$ having the disabling level in phase k+1). In response to this A/D conversion, the residue signal $V_{res2}$ is stored on the switched-capacitors Cex3 and Cex4.

As shown in FIG. 4C, in phase k+2, the switched-capacitors Cex3 and Cex4 are respectively coupled in parallel with the capacitors Cint1 and Cint2 for charge sharing (e.g., operations O3-1 and O3-2). The switched-capacitors Cex1 and Cex2 are coupled between switches of the capacitor array CT2 and the node N2 for sampling the input signal $V_{in}$ (e.g., operations in the sampling time T4-1). Under this condition, the residue signal $V_{res2}$ is transmitted to the capacitors Cint1 and Cint2. Accordingly, the A/D conversion corresponding to the SAR circuitry 140 is completely performed based on the residue signals $V_{res1}$ and $V_{res2}$ (e.g., operation in the time interval of the clock signal $\phi_{s1}$ having the disabling level in phase k+2). In response to this A/D conversion, the residue signal $V_{res1}$ is stored on the switched-capacitors Cex5 and Cex6. By this analogy, operations of the ADC device 100 can be understood.

Figure 5A:
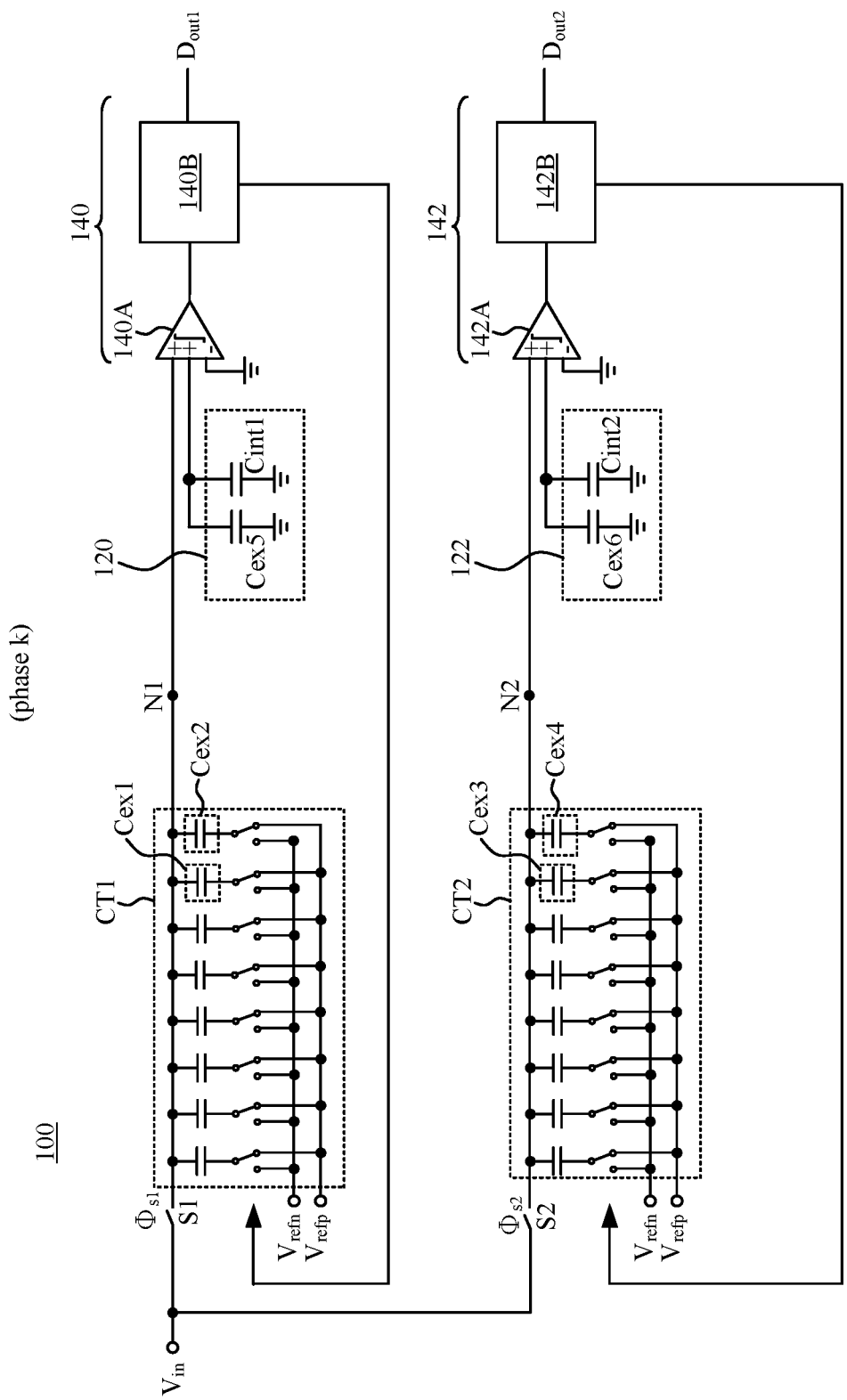
FIG. 5A is a schematic diagram of the ADC device of FIG. 1 in phase k according to some embodiments of the present disclosure.
Figure 5B:
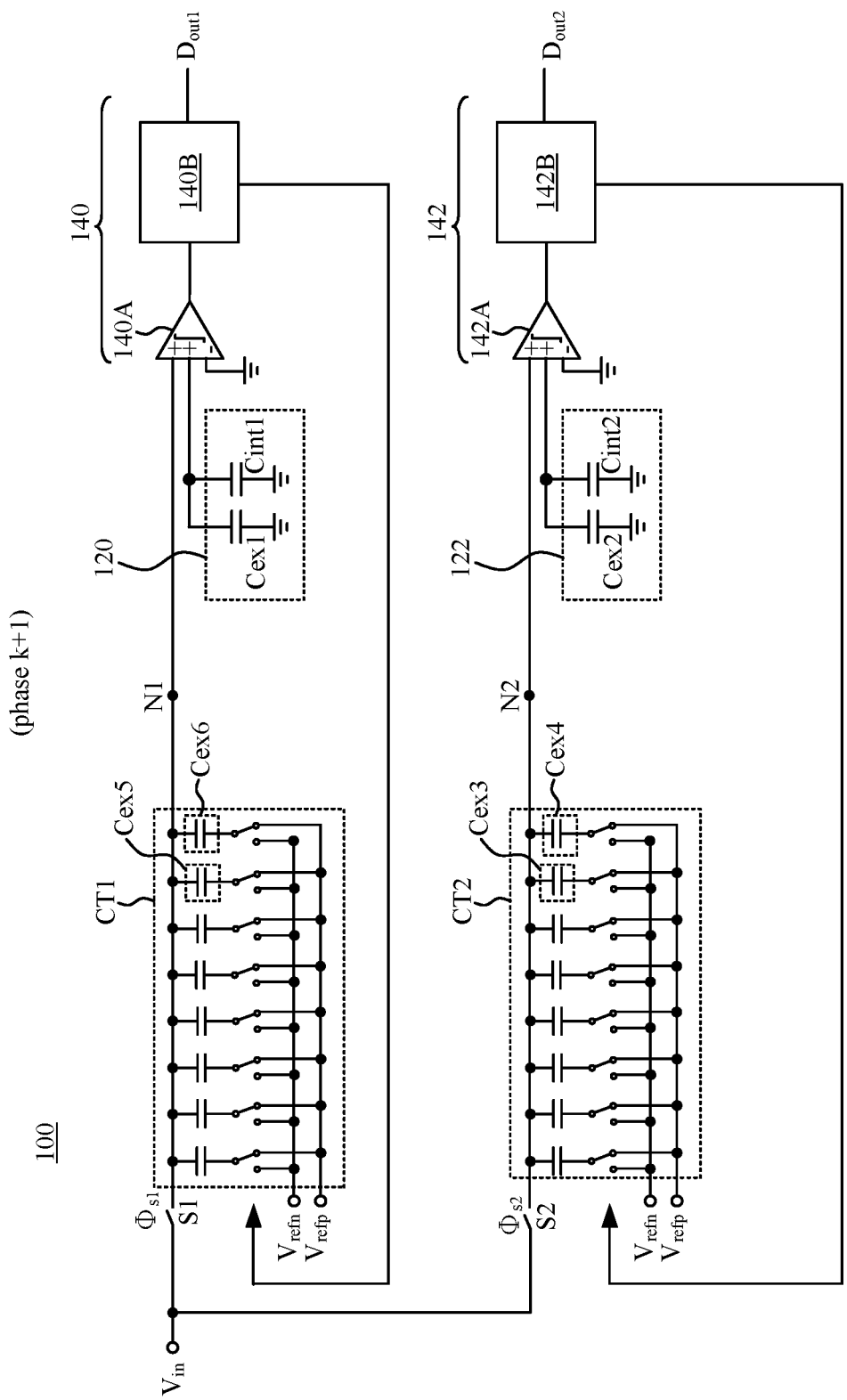
FIG. 5B is a schematic diagram of the ADC device of FIG. 1 in phase k+1 according to some embodiments of the present disclosure.
Figure 5C:
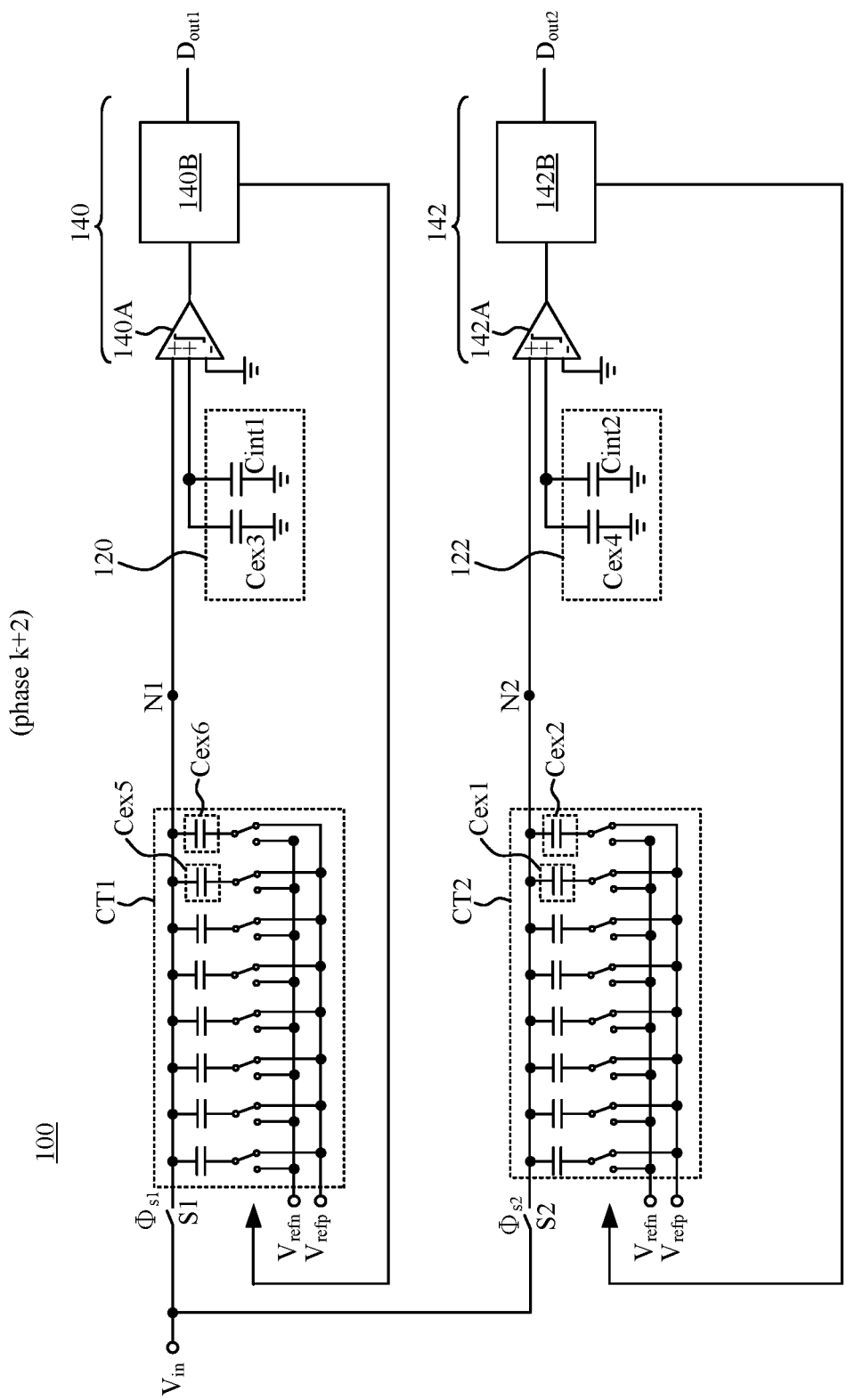
FIG. 5C is a schematic diagram of the ADC device of FIG. 1 in phase k+2 according to some embodiments of the present disclosure.

FIG. 5A is a schematic diagram of the ADC device 100 in phase k according to some embodiments of the present disclosure. FIG. 5B is a schematic diagram of the ADC device 100 in phase k+1 according to some embodiments of the present disclosure. FIG. 5C is a schematic diagram of the ADC device 100 in phase k+2 according to some embodiments of the present disclosure.

Compared with FIGS. 1, and 4A to 4C, as shown in FIG. 5A, the capacitor array CT1 and the noise shaping circuitry 120 are coupled to the quantizer circuit 140A separately (or in parallel), and the capacitor array CT2 and the noise shaping circuitry 122 are coupled to the quantizer circuit 142A separately (or in parallel).

As shown in FIG. 5A, the noise shaping circuitry 120 includes a capacitor Cint1 coupled between a first input terminal of the quantizer circuit 140A and ground, and a second input terminal of the quantizer circuit 140A is coupled to the node N1. The noise shaping circuitry 122 includes a capacitor Cint2 coupled between a first input terminal of the quantizer circuit 142A and ground, and a second input terminal of the quantizer circuit 142A is coupled to the node N2. In some embodiments, the first input terminal and the second input terminal of the quantizer circuit 140A may be coupled to the same node of the quantizer circuit 140A, such that the capacitor array CT1 and the noise shaping circuitry 120 are coupled in parallel. Similarly, in some embodiments, the first input terminal and the second input terminal of the quantizer circuit 142A may be coupled to the same node of the quantizer circuit 142A, such that the capacitor array CT2 and the noise shaping circuitry 122 are coupled in parallel. In some other embodiments, the first input terminal and the second input terminal of the quantizer circuit 140A (or 142A) may be coupled to different nodes of the quantizer circuit 140A (or 142A).

Operations of FIGS. 5A to 5C are similar with the operations of FIGS. 4A to 4C. For example, as shown in FIG. 5A, in phase k, the switched-capacitors Cex1 and Cex2 are coupled between switches of the capacitor array CT1 and the node N1 for the A/D conversion. In response to this A/D conversion, the residue signal $V_{res1}$ is stored on the switched-capacitors Cex1 and Cex2. In the beginning of phase k, the switched-capacitors Cex3 and Cex4 are coupled between switches of the capacitor array CT2 and the node N2 for sampling the input signal $V_{in}$. The switched-capacitors Cex5 and Cex6 are respectively coupled in parallel with the capacitors Cint1 and Cint2 to transmit the residue signal in a previous phase k−1 (not shown).

As shown in FIG. 5B, in phase k+1, the switched-capacitors Cex1 and Cex2 are respectively coupled in parallel with the capacitors Cint1 and Cint2 for charge sharing. The switched-capacitors Cex5 and Cex6 are coupled between switches of the capacitor array CT1 and the node N1 for sampling the input signal $V_{in}$. Under this condition, the residue signal $V_{res1}$ is transmitted to the capacitors Cint1 and Cint2. Accordingly, the A/D conversion corresponding to the SAR circuitry 142 is performed based on the residue signals $V_{res1}$ and $V_{res2}$. In response to this A/D conversion, the residue signal $V_{res2}$ is stored on the switched-capacitors Cex3 and Cex4.

As shown in FIG. 5C, in phase k+2, the switched-capacitors Cex3 and Cex4 are respectively coupled in parallel with the capacitors Cint1 and Cint2 for charge sharing. The switched-capacitors Cex1 and Cex2 are coupled between switches of the capacitor array CT2 and the node N2 for sampling the input signal $V_{in}$. Under this condition, the residue signal $V_{res2}$ is transmitted to the capacitors Cint1 and Cint2. Accordingly, the A/D conversion corresponding to the SAR circuitry 140 is performed based on the residue signals $V_{res1}$ and $V_{res2}$. In response to this A/D conversion, the residue signal $V_{res1}$ is stored on the switched-capacitors Cex5 and Cex6. By this analogy, operations of the ADC device 100 can be understood.

Figure 6:
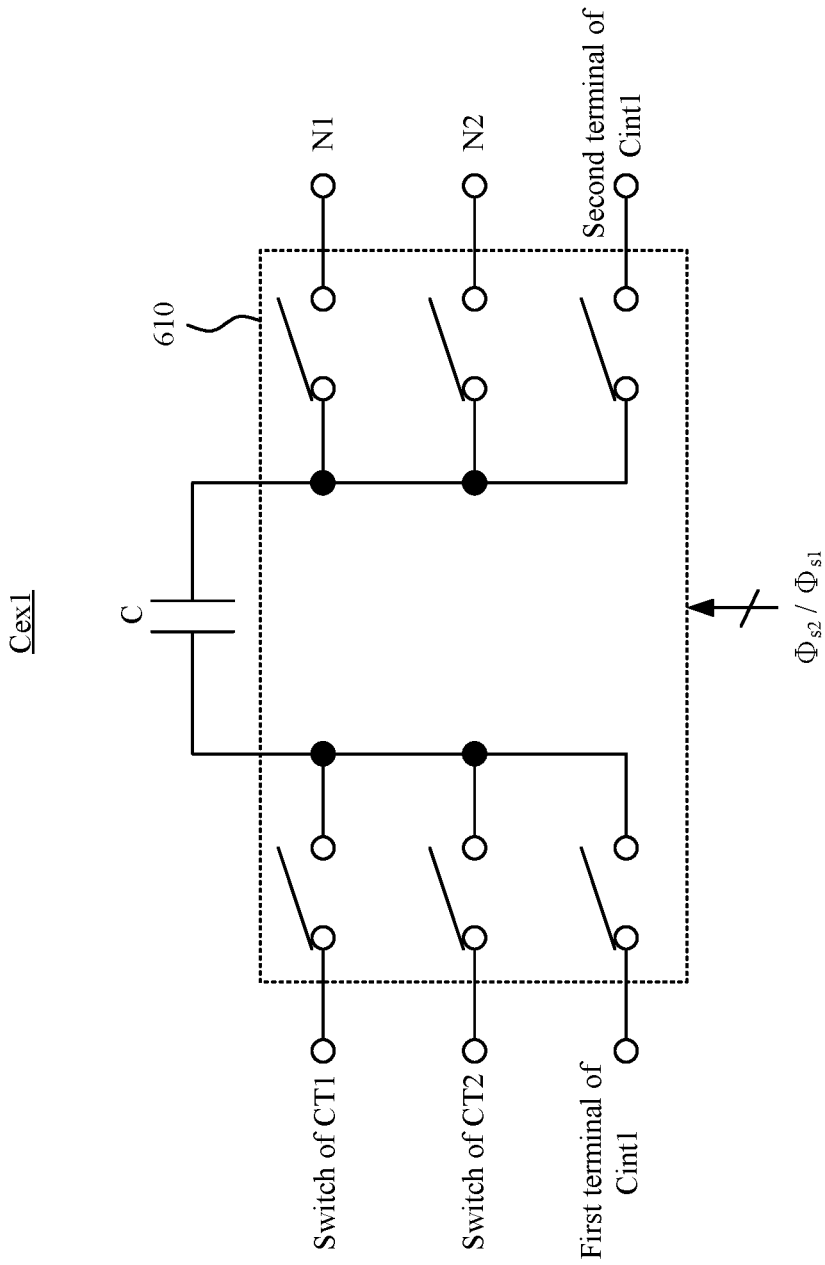
FIG. 6 is a schematic diagram of the switched-capacitor in FIGS. 4A to 4C or FIGS. 5A to 5C according to some embodiments of the present disclosure.

FIG. 6 is a schematic diagram of the switched-capacitor Cex1 in FIGS. 4A to 4C or FIGS. 5A to 5C according to some embodiments of the present disclosure.

As shown in FIG. 6, the switched-capacitor Cex1 includes a capacitor C and a switching circuit 610. The switching circuit 610 operates as a multiplexer circuit based on the clock signal $\phi_{s1}$ and/or the clock signal $\phi_{s2}$, in order to couple the capacitor C between the switches of the capacitor array CT1 and the node N1, or between the switches of the capacitor array CT2 and the node N2, or couple the capacitor C in parallel with the capacitor Cint1. Thus, in different phases, the switched-capacitor Cex1 may be set to provide different functions, as discussed in FIGS. 4A to 4C and/or FIGS. 5A to 5C.

The implementations of the switched-capacitors Cex2 to Cex6 can be understood with reference to FIG. 6. The implementations of the switched-capacitors Cex1 to Cex6 are given for illustrative purposes only, and the present disclosure is not limited thereto.

In the above figures, the ADC device 100 are given with examples where two channels of ADC circuitries are employed, but the present disclosure is not limited thereto. In various embodiments, the ADC device 100 may employ two or more channels of ADC circuitries according to practical needs.

As described above, the ADC device of embodiments of the present disclosure are able to provide a circuit architecture that has a noise-shaping function and time-interleaved conversion. As a result, the overall performance of the ADC device can be improved.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog-to-digital converter (ADC) device, comprising:
    a plurality of capacitor arrays configured to sample an input signal by turns, in order to provide a sampled input signal;
    a plurality of successive approximation register (SAR) circuitries configured to perform an analog-to-digital conversion by turns according to a combination of the sampled input signal, a first residue signal, and a second residue signal, in order to generate a plurality of digital outputs; and
    a plurality of noise shaping circuitries configured to receive a corresponding residue signal of the first residue signal the second residue signal in response to the analog-to-digital conversion, and to shape and transmit the corresponding residue signal to the plurality of SAR circuitries.

2. The ADC device of claim 1, wherein a first SAR circuitry of the plurality of SAR circuitries is configured to perform the analog-to-digital conversion in a first phase, the plurality of noise shaping circuitries are configured to receive the corresponding residue signal that is generated in a second phase, and the second phase is prior to the first phase.

3. The ADC device of claim 1, wherein the corresponding residue signal is transmitted to the plurality of noise shaping circuitries simultaneously.

4. The ADC device of claim 1, wherein the corresponding residue signal are transmitted to the plurality of noise shaping circuitries in different times.

5. The ADC device of claim 1, wherein the plurality of noise shaping circuitries comprises:
    a first noise shaping circuit corresponding to a first capacitor array of the plurality of capacitor arrays, the first noise shaping circuit configured to cooperate with a first SAR circuitry of the plurality of SAR circuitries to perform the analog-to-digital conversion in a first phase; and
    a second noise shaping circuit corresponding to a second capacitor array of the plurality of capacitor arrays, the second noise shaping circuit configured to cooperate with a second SAR circuitry of the plurality of SAR circuitries to perform the analog-to-digital conversion in a second phase,
    wherein the first phase and the second phase are successive phases.

6. The ADC device of claim 5, wherein the first noise shaping circuit comprises a first capacitor, the second noise shaping circuit comprises a second capacitor, and the first noise shaping circuit and the second noise shaping circuit further comprises:
    a plurality of switched-capacitors coupled to the first capacitor array, the second capacitor, and both of the first capacitor and the second capacitor by turns, in order transmit the corresponding residue signal.

7. The ADC device of claim 6, wherein in a first phase,
    a first switched-capacitor and a second switched-capacitor of the plurality of switched-capacitors are coupled in parallel with the first capacitor and the second capacitor respectively, in order to transmit the corresponding residue signal to the first capacitor and the second capacitor,
    a third switched-capacitor and a fourth switched-capacitor of the plurality of switched-capacitors are coupled to the first capacitor array, in order to perform the analog-to-digital conversion, and
    a fifth switched-capacitor and a sixth switched-capacitor of the plurality of switched-capacitors are coupled to the second capacitor array, in order to sample the input signal.

8. The ADC device of claim 7, wherein in a second phase that follows the first phase,
    the third switched-capacitor and the fourth switched-capacitor are coupled in parallel with the first capacitor and the second capacitor respectively, in order to transmit the corresponding residue signal to the first capacitor and the second capacitor, the first switched-capacitor and the second switched-capacitor are coupled to the first capacitor array, in order to sample the input signal, and the fifth switched-capacitor and the sixth switched-capacitor are coupled to the second capacitor array, in order to perform the analog-to-digital conversion.

9. The ADC device of claim 8, wherein in a third phase that follows the second phase, the fifth switched-capacitor and the sixth switched-capacitor are coupled in parallel with the first capacitor and the second capacitor respectively, in order to transmit the corresponding residue signal to the first capacitor and the second capacitor, the first switched-capacitor and the second switched-capacitor are coupled to the first capacitor array, in order to perform the analog-to-digital conversion, and the third switched-capacitor and the fourth switched-capacitor are coupled to the second capacitor array, in order to sample the input signal.

10. The ADC device of claim 5, wherein the first noise shaping circuit and the first capacitor array are coupled in series and are coupled to an input terminal of the first SAR circuitry, and the second noise shaping circuit and the second capacitor array are coupled in series and are coupled to an input terminal of the second SAR circuitry.

11. The ADC device of claim 5, wherein the first noise shaping circuit and the first capacitor array are separately coupled to the first SAR circuitry, and the second noise shaping circuit and the second capacitor array are separately coupled to the second SAR circuitry.

12. The ADC device of claim 5, wherein a time interval of the first SAR circuitry performing the analog-to-digital conversion and a time interval of the second capacitor array sampling the input signal are partially overlapped.

13. The ADC device of claim 5, wherein a time interval of the second SAR circuitry performing the analog-to-digital conversion and a time interval of the first capacitor array sampling the input signal are partially overlapped.

14. The ADC device of claim 1, wherein in two successive phases, a time interval for performing the analog-to-digital Conversion is longer than a time interval for sampling the input signal.

15. The ADC device of claim 1, wherein in two successive phases, a time interval for performing the analog-to-digital conversion is the same as a time interval for sampling the input signal.

16. The ADC device of claim 1, wherein when a first capacitor array of the plurality of capacitor arrays samples the input signal in a first phase, a second capacitor array of the plurality of capacitor arrays provides the sampled input signal in a second phase to the plurality of noise shaping circuitries, wherein the first phase follows the second phase.

17. The ADC device of claim 1, further comprising:

a data combination circuitry configured to combine the plurality of digital outputs as digital data.

18. The ADC device of claim 1, wherein each of the plurality of SAR circuitries comprises:

a quantizer circuit; and a control logic circuit, the quantizer circuit and control logic circuit configured to perform a binary search algorithm to control switches of a corresponding one of the plurality of capacitor arrays based on the combination of the sampled input signal, the first residue signal, and the second residue signal, in order to perform the analog-to-digital conversion.

19. The ADC device of claim 1, wherein the first residue signal is stored on a first capacitor array of the plurality of capacitor arrays in response to the analog-to-digital conversion performed by a first SAR circuitry of the plurality of SAR circuitries.

20. The ADC device of claim 19, wherein the first residue signal is stored on the first capacitor array in a progress of the analog-to-digital conversion, or after the first SAR circuitry completes the analog-to-digital conversion.

* * * * *